(12) United States Patent
Balakrishnan et al.

(10) Patent No.: US 8,035,945 B2
(45) Date of Patent: Oct. 11, 2011

(54) METHOD AND APPARATUS PROVIDING FINAL TEST AND TRIMMING FOR A POWER SUPPLY CONTROLLER

(75) Inventors: Balu Balakrishnan, Saratoga, CA (US); Alex B. Djenguerian, Saratoga, CA (US); Erdem Bircan, San Carlos, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 12/973,728

(22) Filed: Dec. 20, 2010

(65) Prior Publication Data

US 2011/0084679 A1 Apr. 14, 2011

Related U.S. Application Data

(60) Division of application No. 12/484,982, filed on Jun. 15, 2009, now Pat. No. 7,881,032, which is a division of application No. 12/137,453, filed on Jun. 11, 2008, now Pat. No. 7,710,705, which is a continuation of application No. 11/789,924, filed on Apr. 25, 2007, now Pat. No. 7,400,483, which is a continuation of application No. 11/207,503, filed on Aug. 19, 2005, now Pat. No. 7,227,733, which is a continuation of application No. 10/834,667, filed on Apr. 29, 2004, now Pat. No. 6,954,057, which is a continuation of application No. 10/076,851, filed on Feb. 14, 2002, now Pat. No. 6,750,640, which is a division of application No. 09/407,609, filed on Sep. 28, 1999, now Pat. No. 6,388,853.

(51) Int. Cl.
*H02H 5/04* (2006.01)
*H01H 37/76* (2006.01)

(52) U.S. Cl. ............ 361/103; 326/37; 326/38; 327/529; 327/530

(58) Field of Classification Search .................. 361/103; 327/525, 530; 326/37, 38
See application file for complete search history.

(56) References Cited

U.S. PATENT DOCUMENTS 4,415,959 A 11/1983 Vinciarelli
(Continued)

OTHER PUBLICATIONS

McMos Handbook, Motorola Inc. 1974, pp. 3-26-3-27, 3-31.

*Primary Examiner* — Rexford N. Barnie
*Assistant Examiner* — Zeev V. Kitov
(74) *Attorney, Agent, or Firm* — Blakely Sokoloff Taylor & Zafman LLP

(57) ABSTRACT

A power supply controller having final test and trim circuitry. In one embodiment, a power supply controller for switched mode power supply includes a selector circuit, a trim circuit, a shutdown circuit and a disable circuit. The trim circuit includes a programmable circuit connection that can be selected by the selector circuit by toggling a voltage on an external terminal such as for example a power supply terminal, a control terminal or a function terminal of the power supply controller. The programmable circuit connection in the trim circuit can be programmed by applying a programming voltage to the external terminal. The shutdown circuit shuts down the power supply controller if the temperature rises above an over temperature threshold voltage. The shutdown circuit includes adjustment circuitry that can be used to test the shutdown circuit. The adjustment circuitry can adjust and reduce the over temperature threshold of the power supply controller. Thus, the power supply controller can be tested without having to actually heat the part. The disable circuit includes a programmable circuit connection, which when programmed prevents further trimming of power supply controller and prevents adjustment of the shutdown circuit over temperature threshold.

5 Claims, 3 Drawing Sheets

U.S. PATENT DOCUMENTS

| | | |
|---|---|---|
| 4,466,052 A | 8/1984 | Thrap |
| 4,550,360 A | 10/1985 | Dougherty |
| 4,599,548 A | 7/1986 | Schultz |
| 4,751,454 A | 6/1988 | Dielacher et al. |
| 4,791,612 A | 12/1988 | Yoshida |
| 4,937,465 A | 6/1990 | Johnson et al. |
| 5,163,021 A | 11/1992 | Mehrotra et al. |
| 5,319,370 A | 6/1994 | Signore et al. |
| 5,443,534 A | 8/1995 | Vinciarelli et al. |
| 5,469,109 A | 11/1995 | Paivinen |
| 5,497,285 A | 3/1996 | Nadd |
| 5,563,549 A | 10/1996 | Shieh |
| 5,767,732 A | 6/1998 | Lee et al. |
| 5,838,076 A | 11/1998 | Zarrabian et al. |
| 5,905,370 A | 5/1999 | Bryson |
| 6,060,899 A | 5/2000 | Hamada |
| 6,075,354 A | 6/2000 | Smith et al. |
| 6,130,571 A | 10/2000 | Yamamoto |
| 6,388,853 B1 | 5/2002 | Balakrishnan et al. |
| 6,407,959 B2 * | 6/2002 | Ishikawa et al. ............. 365/226 |
| 6,442,500 B1 | 8/2002 | Kim |

* cited by examiner

METHOD AND APPARATUS PROVIDING FINAL TEST AND TRIMMING FOR A POWER SUPPLY CONTROLLER

REFERENCE TO PRIOR APPLICATIONS

This application is a divisional of and claims priority to U.S. application Ser. No. 12/484,982, filed Jun. 15, 2009, now pending, which is a divisional of U.S. application Ser. No. 12/137,453, filed Jun. 11, 2008, now U.S. Pat. No. 7,710,705, which is a continuation of U.S. application Ser. No. 11/789,924, filed Apr. 25, 2007, now U.S. Pat. No. 7,400,483, which is a continuation of U.S. application Ser. No. 11/207,503, filed Aug. 19, 2005, now U.S. Pat. No. 7,227,733, which is a continuation of U.S. application Ser. No. 10/834,667, filed Apr. 29, 2004, now U.S. Pat. No. 6,954,057, which is a continuation of U.S. application Ser. No. 10/076,851, filed Feb. 14, 2002, now U.S. Pat. No. 6,750,640, which is a divisional of U.S. application Ser. No. 09/407,609, filed Sep. 28, 1999, now U.S. Pat. No. 6,388,853. U.S. application Ser. No. 12/484,982 and U.S. Pat. Nos. 7,710,705, 7,400,483, 7,227,733, 6,954,057, 6,750,640, and 6,388,853 are hereby incorporated by reference.

BACKGROUND OF THE INVENTION

1. Field of the Invention

The present invention relates generally to power supplies and, more specifically, the present invention relates to a switched mode power supply controller.

2. Background Information

Electronic devices use power to operate. Switched mode power supplies are commonly used due to their high efficiency and good output regulation to power many of today's electronic devices. In a known switched mode power supply, a low frequency (e.g. 50 Hz or 60 Hz mains frequency), high voltage alternating current (AC) is converted to high voltage direct current (DC) with a diode rectifier and capacitor. The high voltage DC is then converted to high frequency (e.g. 30 to 300 kHz) AC, using a switched mode power supply control circuit. This high frequency, high voltage AC is applied to a transformer to transform the voltage, usually to a lower voltage, and to provide safety isolation. The output of the transformer is rectified to provide a regulated DC output, which may be used to power an electronic device. The switched mode power supply control circuit provides usually output regulation by sensing the output controlling it in a closed loop.

A switched mode power supply may include an integrated circuit power supply controller coupled in series with a primary winding of the transformer. Energy is transferred to a secondary winding from the primary winding in a manner controlled by the power supply controller to provide the clean and steady source of power at the DC output. The transformer of a switched mode power supply may also include another winding called a bias or feedback winding. The bias winding provides the operating power for the power supply controller and in some cases it also provides a feedback or control signal to the power supply controller. In some switched mode power supplies, the feedback or control signal can come through an opto-coupler from a sense circuit coupled to the DC output. The feedback or control signal may be used to modulate a duty cycle of a switching waveform generated by the power supply controller or may be used to disable some of the cycles of the switching waveform generated by the power supply controller to control the DC output voltage.

In order to compensate for process variations, analog integrated circuits such as power supply controllers are commonly trimmed for critical parameters during wafer sort, using trim pads on the wafer before being assembled in plastic packages. Trimming is done at the wafer level because the trim pads are not usually accessible after assembly (e.g. after encapsulation in plastic). Some of the tests are also only done at the wafer level because they require access to internal circuitry through test pads, which are accessible (through probes) only at wafer sort.

The disadvantage of trimming at wafer sort is that the trimmed parameters are subject to shifts due to physical stresses that the die is subjected to after assembly by the encapsulation material such as plastic. This limits the accuracy to which they can be guaranteed independent of how accurately it is trimmed at wafer sort. Consequently, the assembled parts are then tested again at final test to eliminate those parts that have shifted too much or were damaged during assembly.

SUMMARY OF THE INVENTION

Power supply controller methods and apparatuses are disclosed. In one embodiment, a power supply controller circuit is described including an external terminal and a trim circuit coupled to the external terminal. The external terminal may be any one or more of a power supply terminal, a control terminal or a function terminal of the power supply controller circuit. The trim circuit includes a first programmable circuit connection to be programmed in response to a signal on the external terminal. In another embodiment, the power supply controller includes a shutdown circuit coupled to the external terminal to disable the power supply controller during normal operation if a temperature of the shutdown circuit rises above a first threshold temperature. The shutdown circuit includes adjustment circuitry configured to adjust the first threshold temperature to a second or third threshold temperature in response to a signal on the power supply terminal during final test and trim of the power supply controller. In one embodiment, disable circuitry is included to disable further testing and trimming of the power supply controller and permanently set the shutdown circuit to disable the power supply controller when the temperature rises above the first temperature threshold. Additional features and benefits of the present invention will become apparent from the detailed description, figures and claims set forth below.

BRIEF DESCRIPTION OF THE DRAWINGS

The present invention detailed illustrated by way of example and not limitation in the accompanying figures.

DETAILED DESCRIPTION

Figure 1:
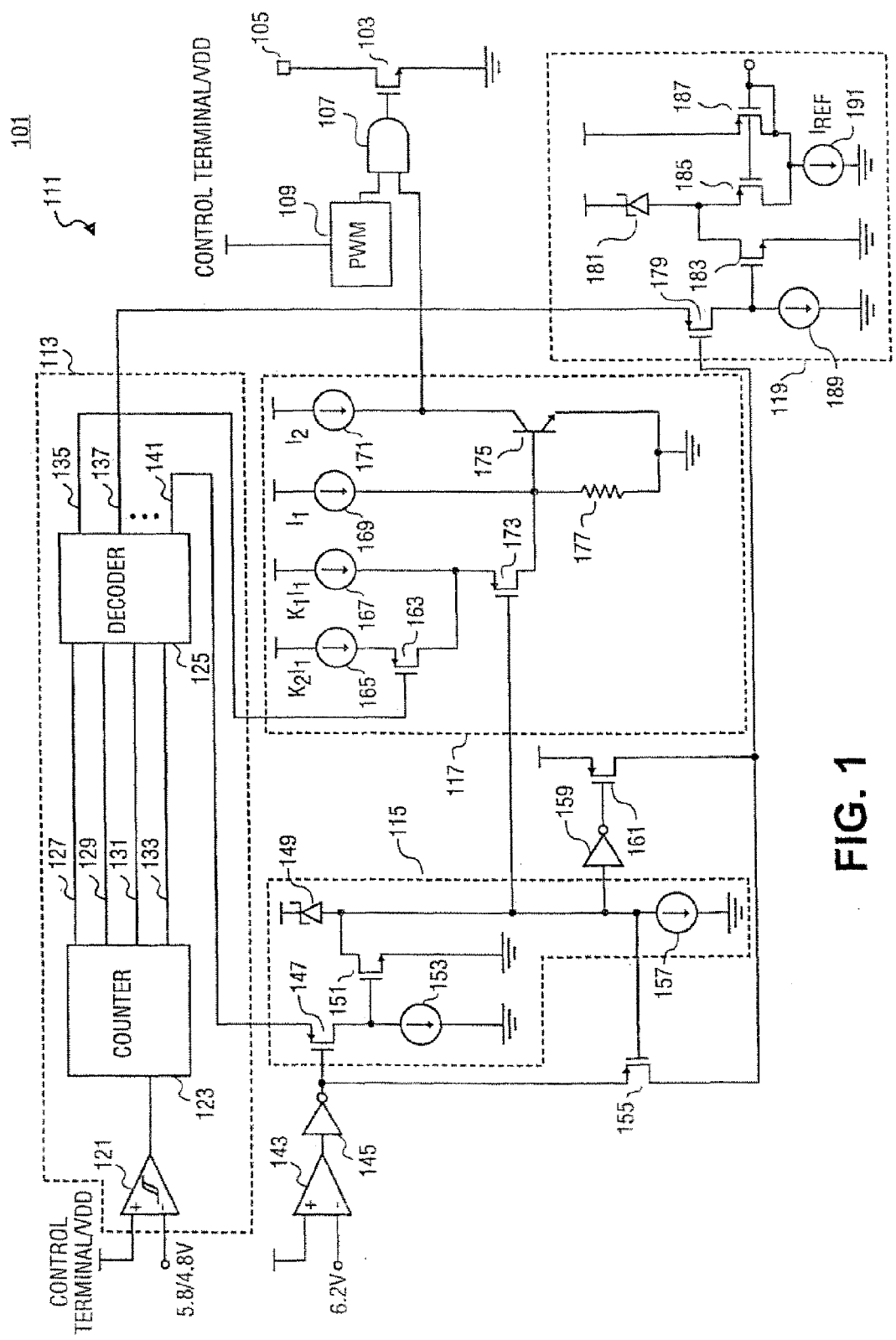
FIG. 1 is a schematic illustrating one embodiment of a power supply controller having a trimming and testing circuitry in accordance with the teachings of the present invention.

A method and an apparatus providing final test and trimming for a power supply controller is disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

During the fabrication process of an integrated circuit chip, the chip is often tested and trimmed. Trimming can be thought of as the process of fine-tuning or calibrating particular parameters of the chip. These parameters may vary from chip to chip due to a number of reasons including different process variations during manufacturing. For example, integrated circuit reference current sources may need to be trimmed before the chips are shipped to ensure that the current sources provide the proper amount of current.

Trimming can also be used to set certain programmable functions and/or parameters of the power supply controller chip such as for example but not limited to: trimming an over voltage threshold of the power supply controller, trimming an under voltage threshold of the power supply controller, trimming switch frequencies of the power supply controller, trimming a current limit of a power switch of the power supply controller, and the like.

In one embodiment, the present invention allows power supply controller parts to be trimmed during final test, after packaging, encapsulation/assembly, without using any extra electrical terminals. In one embodiment, the trimming is done through one or more of the already existing external terminals of the power supply controller such as for example the power supply terminal, the control terminal, the function terminal or the like. In one embodiment, the power supply terminal is a terminal through which power supply controller circuitry is powered. In one embodiment, the control terminal is a terminal through which the power supply controller receives a feedback signal from the power supply output. In one embodiment, the power supply terminal and the control terminal are the same electrical terminal on the power supply controller. In one embodiment, the function terminal is the terminal through which functions of the power supply controller may be controlled. Examples of such functions of the power supply controller controlled through the function terminal include but are not limited to over voltage threshold adjustment, under voltage threshold adjustment, external current limit adjustment, maximum duty cycle adjustment, power supply enable/disable or the like.

In one embodiment, the present invention also allows internal circuitry of the power supply controller, such as a thermal shutdown circuit, to be adjusted and tested at final test after packaging or encapsulation through the same $V_{DD}$ power supply terminals. Thus, in one embodiment, an integrated circuit die including power supply controller circuitry of the present invention is packaged or encapsulated. Afterwards, parameters of the power supply controller may be final tested and trimmed through an external terminal in accordance with the teachings of the present invention. In some instances, this may eliminate the need for wafer sort testing all together in cases where the wafer sort yield is high enough to make it cost effective to assemble all units on a wafer and test them only once at final test to reject the defective parts. In addition, since trimming can be done at final test after packaging or encapsulation, one embodiment of the present invention increases the accuracy of parameters trimmed or tested because there is no shift in their value after trimming.

In one embodiment of the present invention, final test and trimming are performed with the use of programmable circuit connections. For purposes of this disclosure, programmable circuit connections are discretionary circuit connections that can be connected or disconnected as desired. Examples of programmable circuit connections include but are not limited to antifuses and/or fuses. When a fuse is initially fabricated, it normally provides a low resistance connection. After the fuse is programmed, the fuse provides a permanent high resistance or open circuit connection. Conversely, when an antifuse device is initially fabricated, it provides a high resistance connection. However, after the antifuse is programmed, or fused, it provides a permanent low resistance electrical connection.

In one embodiment of the present invention, zener diodes are used for antifuse programmable circuit connections. It is appreciated, however, that fuses can be used in accordance with the teachings of the present invention. Unfused zener diodes are generally programmed or zapped with the application of a high programming voltage and current. After the application of the programming voltage and current, the zener diode is permanently programmed from a high resistance to a low resistance electrical connection.

FIG. 1 is a schematic of one embodiment of a power supply controller 101 in accordance with the teachings of the present invention. Power supply controller 101 includes a power switch 103 coupled between a drain terminal 105 and a ground terminal. In one embodiment, power switch 103 is controlled by a control circuit, shown as a pulse width modulator (PWM) 109, coupled to a control terminal and gate of power switch 103 through AND gate 107. In one embodiment, final test and trim circuit 111 is coupled to another input of AND gate 107.

In one embodiment, a primary winding (not shown) of a transformer of a switched mode power supply is configured to be coupled to drain terminal 105. When power switch 103 is turned on, current flows through the primary winding of the transformer. When current flows through the primary winding, energy is stored in the transformer. When power switch 103 is turned off, current does not flow through the primary winding and the energy stored in the transformer is transferred from a secondary winding (not shown) to the power supply output.

In one embodiment, test and trim circuit 111 includes a selector circuit 113, a disable circuit 115, a shutdown circuit 117 and one or more trim circuits including trim circuit 119. As shown, selector circuit 113 includes a hysteretic comparator 121 having an input coupled to a control terminal of the power supply controller 101. In one embodiment, an external power supply terminal is a control terminal and/or a $V_{DD}$ terminal of power supply controller 101. In another embodiment, hysteretic comparator 121 can be removed and instead the input of counter 123 can be driven by a circuit coupled to a function terminal (not shown) of power supply controller 101. In one embodiment, hysteretic comparator 121 includes threshold voltage settings of 5.8 volts and 4.8 volts. Thus, the threshold settings of hysteretic comparator 121 toggle between 5.8 volts and 4.8 volts in one embodiment. In one embodiment, counter 123 is coupled to an output of hysteretic comparator 121. Counter 123 includes a plurality of outputs including outputs 127, 129, 131 and 133. It is appreciated that counter 123 may include more or less outputs in accordance with the teachings of the present invention. In the embodiment depicted, decoder 125 is coupled to receive outputs 127, 129, 131 and 133 of counter 123. In the embodiment depicted in FIG. 1, decoder 125 generates a plurality of outputs including select line 135, select line 137 and select line 141.

In one embodiment, final test and trim circuit 111 includes another comparator 143 having an input coupled to the power supply terminal. In one embodiment, the threshold setting of comparator 143 is 6.2 volts. In one embodiment, an inverter 145 is coupled to an output of comparator 143.

In one embodiment, disable circuit 115 includes a programmable circuit connection 149 coupled to the power supply terminal. In one embodiment, programmable circuit connection 149 is a zener diode or antifuse. A transistor 151 is coupled between programmable circuit connection 149 and ground. A current source 157 is also coupled between programmable circuit connection 149 and ground. In one embodiment, current source 157 is a 1 microamp current source. As shown in FIG. 1, a transistor 147 is coupled between select line 141 and a control terminal or gate of transistor 151. In addition, a current source 153 is coupled between the gate of transistor 151 and ground. In one embodiment, the gate of transistor 147 is coupled to an output of inverter 145. In one embodiment, current source 153 is a 1 microamp current source.

In one embodiment, final test and trim circuit 111 also includes an inverter 159 having an input coupled to programmable circuit connection 149 and coupled to current source 157. An output of inverter 159 is coupled to the gate of a transistor 161. An input of inverter 159 is also coupled to a gate of a transistor 155. In one embodiment, the source of transistor 155 is coupled to an output of inverter 145. The source of transistor 161 is coupled to the power supply terminal. In one embodiment, the drain of transistor 155 is coupled to the drain the transistor 161.

In one embodiment, shutdown circuit 117 includes current source 165, current source 167, current source 169 and current source 171 all coupled to the power supply terminal. In one embodiment, current source 169 has a current of $I_1$, current source 171 has a current of $I_2$, current source 167 has a current of $K_1 I_1$ and current source 165 has a current of $K_2 I_1$. In one embodiment, $I_2$ is independent of temperature and $I_t$ is proportional to temperature. In one embodiment, $K_1$ is a constant approximately equal to 1.05 and $K_2$ is a constant approximately equal to 0.3. In one embodiment, shutdown circuit 117 includes a transistor 175 coupled between current source 171 and ground. In one embodiment, shutdown circuit 117 includes a resistor 177 having a resistance R coupled between current source 169 and ground. In addition, the base of transistor 175 is coupled to current source 169 and resistor 177. In one embodiment, shutdown circuit 117 includes transistor 173 coupled between current source 167 and resistor 177. In one embodiment, shutdown circuit 117 also includes transistor 163 coupled between current source 165 and the source of transistor 173. As shown in FIG. 1, the gate of transistor 163 is coupled to select line 135 and the gate of transistor 173 is coupled to programmable circuit connection 149.

In one embodiment, trim circuit 119 includes a programmable circuit connection 181 coupled to the power supply terminal. In one embodiment, programmable circuit connection 181 is a zener diode or antifuse. A transistor 183 is coupled between programmable circuit connection 181 and ground. Trim circuit 119 also includes a reference current source 191 coupled to ground. In one embodiment, transistor 187 is coupled between the power supply terminal and reference current source 191. In addition, transistor 185 is coupled between programmable circuit connection 181 and reference current source 191. The gates of transistors 185 and 187 are coupled to their drains and to each other. In one embodiment, trim circuit 119 also includes a transistor 179 coupled between select line 137 and the gate of transistor 183. In one embodiment, the gate of transistor 179 is coupled to the drain of transistor 161 and coupled to the drain of transistor 155. In one embodiment, trim circuit 119 also includes a current source 189 coupled between the gate of transistor 183 and ground. In one embodiment, current source 189 is a 1 microamp current source.

High level operation of final trim and test circuit 111 of FIG. 1 is as follows. First, final test trimming of critical parameters is determined by selecting the desired programmable circuit connections to program. For example, programmable circuit connection 181 of trim circuit 119 may be selected for trimming during final test and trim to fine-tune the size of transistor 187 where reference current source 191 passes. The gate voltage of transistor 187 is used in one embodiment to generate one or more other reference current sources (not shown) in the power supply controller 111. Therefore, by adjusting the size of transistor 187, these reference current sources connected to its gate are trimmed. In one embodiment, to program programmable circuit connection 181, the voltage on the power supply terminal is increased to a voltage well above the normal operating voltage. In one embodiment, the normal operating voltage of power supply controller is 5.8V and the programming voltage is 11.2V. It is appreciated that other voltages may be used in accordance with the teachings of the present invention.

In one embodiment, to select the correct programmable circuit connection, the power supply terminal or $V_{DD}$ is toggled between two voltage levels. In one embodiment, the power supply terminal is toggled between 6.4V and 4.3V to increment counter 123. It is appreciated that other voltages may be used in accordance with the teachings of the present invention. The outputs 127, 129, 131 and 133 of counter 123 select a specific programmable circuit connection to be programmed. For instance, to select programmable circuit connection 181, $V_{DD}$ is toggled until select line 137 selects trim circuit 119.

In one embodiment, once the desired state of the counter 123 is reached (i.e. the desired programmable circuit connection is selected), then the $V_{DD}$ voltage is raised to the programming voltage to program the selected programmable circuit connection. In one embodiment, after an antifuse or zener diode programmable circuit connection is programmed, the programmable circuit connection becomes permanently shorted and no longer provides a high resistance connection.

In one embodiment, after desired trimmings are completed, a final programmable circuit connection is selected and programmed to prevent further trimming of power supply controller 101. In the embodiment illustrated in FIG. 1, the final programmable circuit connection is programmable circuit connection 149 of disable circuit 115.

In one embodiment, each critical parameter can be trimmed to the desired accuracy by allocating a number of programmable circuit connections to that parameter. When more than one programmable circuit connection is assigned to a critical parameter, each programmable circuit connection trim is designed to have different weight affecting that parameter. Thus, if a parameter is slightly off from the designed value, then the first programmable circuit connection that has the smallest weight can be programmed. If the parameter needs more adjustment, then another combination of programmable circuit connections assigned to that parameter may be programmed. Binary weighting of programmable circuit connections can be used to reduce the number of trims for a given accuracy and trim range.

In one embodiment, final test trimming can also be used to alter the operating parameters or the functionality of the power supply controller 101 in a digital fashion. For example, by programming a programmable circuit connection, an operating frequency of power supply controller 101 can be halved.

In one embodiment, the operating frequency may be halved after it is trimmed for accuracy.

Figure 2:
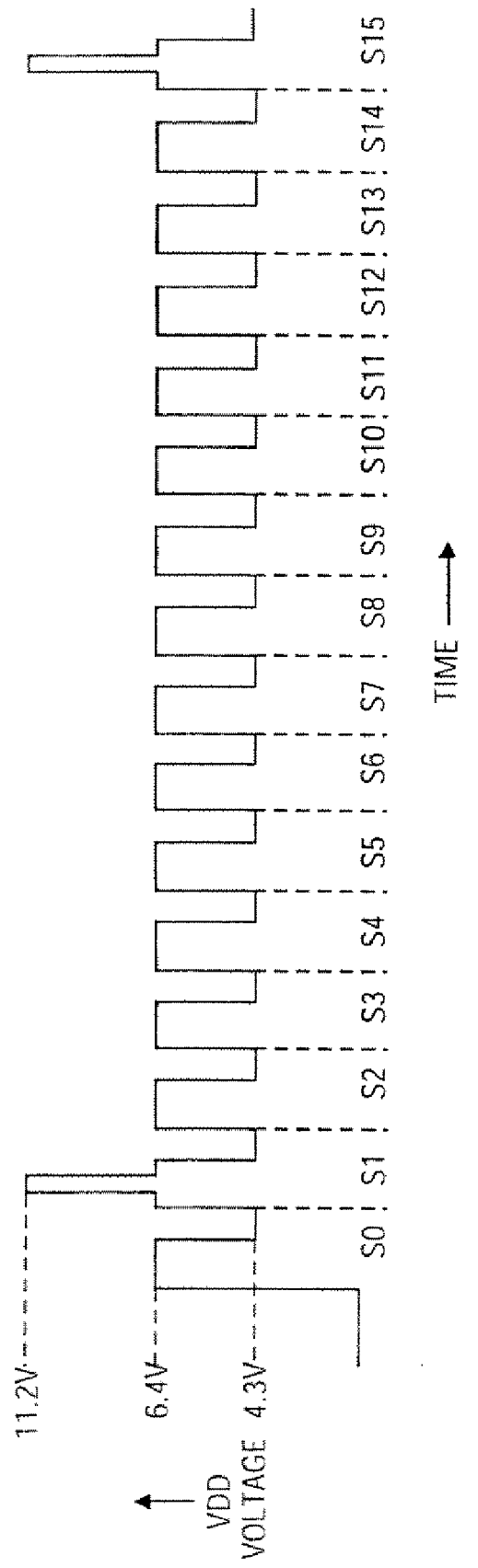
FIG. 2 shows one embodiment of a timing diagram illustrating a signal on a power supply terminal in accordance with the teachings of the present invention.

FIG. 2 shows one embodiment of a timing diagram illustrating a signal on a power supply terminal $V_{DD}$ for the trimming procedure for programming the first programmable circuit connection and the final programmable circuit connection. In the example illustrated in FIG. 2, assume that programmable circuit connection 181 of FIG. 1 is selected in the S1 state and that programmable circuit connection 149 is selected in the S15 state.

As shown in the embodiment depicted, the power supply terminal $V_{DD}$ is toggled between 6.4V and 4.3V to increment counter 123. Indeed, 6.4V is greater than the upper threshold (5.8V) of hysteretic comparator 121 and 4.3 volts is less than the lower threshold (4.8V) of hysteretic comparator 121. It is appreciated that other voltages may be used in accordance with the teachings of the present invention. As will be discussed in greater detail below, in the S1 state, select line 137 selects programmable circuit connection 181 and the application of 11.2 volts programs programmable circuit connection 181. Similarly, in the S15 state, select line 141 selects programmable circuit connection 149 and the application of 11.2 volts programs the final programmable circuit connection 149. In one embodiment, after the programmable circuit connection 149 is programmed, further trimming by programming any of the unprogrammed programmable circuit connections is not possible, which avoids accidental trimming in the future.

In one embodiment, shutdown circuit 117 provides self protection to power supply controller 101 with over temperature shutdown. In one embodiment, if the internal temperature of the power supply controller 101 reaches the over temperature threshold, power switch 103 is no longer switched and the power supply is thereby disabled. In one embodiment, the over temperature threshold is approximately 135° C.

In one embodiment, over temperature threshold testing during final test is done at room temperature, before final programmable circuit connection 149 is programmed. In one embodiment, before programmable circuit connection 149 is programmed, shutdown circuitry 117 operates in two modes. In the first mode, an addition of one mirrored current source 167 adjusts or reduces the thermal shutdown threshold to typically 33° C. in one embodiment. In the second mode, which can be selected by setting the counter 123 to the particular state to activate select line 135, another current source 165 is added. In one embodiment, the second mode can be alternatively selected through another external terminal (not shown). In one embodiment, this further adjusts or reduces the thermal shutdown temperature threshold to 13° C.

In one embodiment, when testing the power supply controller 101 in these two modes at room temperature (e.g. 22° C.), power supply controller 101 will not be in thermal shutdown in mode one. In mode two, however, power supply controller 101 should be in thermal shutdown mode. Therefore, in one embodiment, the over temperature aspect shutdown circuitry 117 can be tested without actually having to raise the temperature of power supply controller 101 to the thermal shutdown temperature (e.g. approximately 135° C.). In one embodiment, these modes of operation will be disabled as soon as programmable circuit connection 149 is programmed. In one embodiment, the testing of two modes before programmable circuit connection 149 is programmed verifies that the thermal shutdown threshold afterwards will be about 135° C. with a variation of +/−10° C.

A detailed description of the final test and trim circuit 111 of FIG. 1 is as follows. As mentioned above, the power supply terminal $V_{DD}$ is toggled in one embodiment between 6.4V and 4.3V to select the desired programmable circuit connections. The output of hysteretic comparator 121 is received by counter 123. In one embodiment, counter 123 is a resetable flip-flop counter, which is reset during initial power up of power supply controller 101. The outputs 127, 129, 131 and 133 of the counter 123 are received by decoder 125, which selects the desired programmable circuit connections to be programmed. In one embodiment counter has N outputs and decoder has $2^N$ select lines as outputs.

In the embodiment depicted in FIG. 1, to select programmable circuit connection 181, $V_{DD}$ is first raised to 6.4V then lowered to 4.3V and then raised again to 6.4V. In FIG. 2, this corresponds to state S1. At this point, the decoder 125 activates signal line 137. In one embodiment, comparator 143 is a comparator with a threshold of 6.2V. When $V_{DD}$ is above 6.4V, the output of comparator 143 is high and the output of inverter 145 is low. Transistor 155 is on and transistor 161 is off since programmable circuit connection 149 is not programmed yet (high impedance) and the gate of transistor 155 is pulled low by current source 157. Since transistor 155 is on, the low signal at the output of inverter 145 appears at the gate of transistor 179, turning it on. The gate of transistor 183 is now connected to the select signal line 137, which was activated. Transistor 183 therefore turns on, enabling programmable circuit connection 181 to be programmed.

In one embodiment, however, transistor 183 can not yet program programmable circuit connection 181 because programmable circuit connection 181 requires about 40 mA of current flowing through it. In one embodiment, this requires a power supply terminal $V_{DD}$ voltage of 10V since the unprogrammed zener voltage of programmable circuit connection 181 is its zener junction voltage drop plus the resistive drop when the required 40 mA is applied. In one embodiment, the Zener junction voltage drop is 4.7V. In one embodiment, the resistive drop is almost 4V, which translates into approximately 40 mA times the zener resistance of programmable circuit connection 181, which is approximately 100 Ohms. Transistor 183 is designed such that the voltage from drain to source is small when it passes 40 mA. In one embodiment, in order to proceed with programming programmable circuit connection 181, $V_{DD}$ must therefore be raised to about 11.2V. When programmable circuit connection 181 is programmed, the source of transistor 185 is thereby shorted to $V_{DD}$ and transistors 185 and 187 are connected in parallel to $V_{DD}$, thereby increasing the effective size of transistor 187. In this example, by increasing the size of transistor 187, the trimming of a certain critical parameter is achieved.

Figure 3:
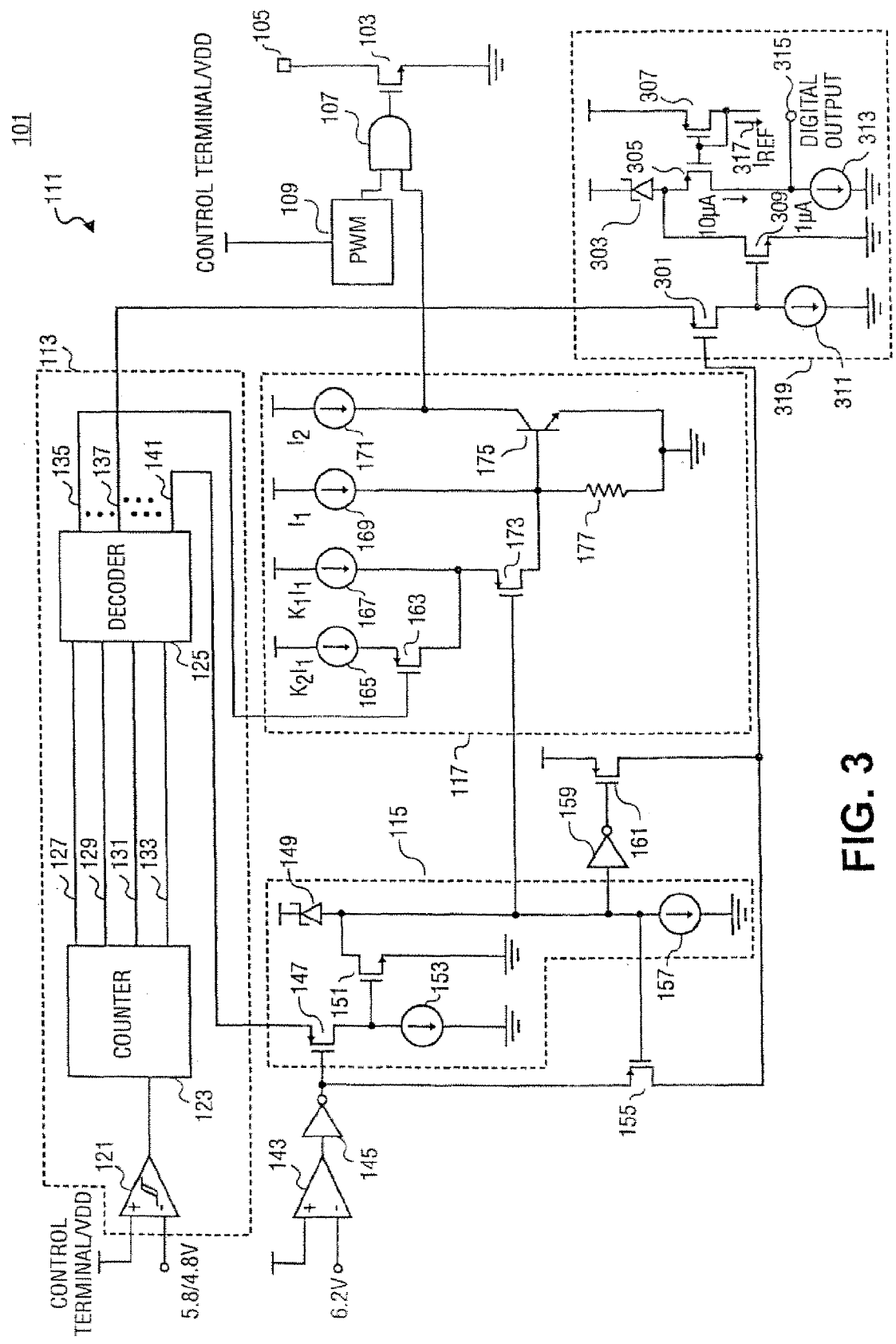
FIG. 3 is a schematic illustrating another embodiment of a power supply controller having a trimming and testing circuitry in accordance with the teachings of the present invention.

FIG. 3 is a schematic illustrating another embodiment of a power supply controller having trimming and testing circuitry in accordance with the teachings of the present invention. FIG. 3 shows final test trimming to generate a digital level digital output 315 that can be used to select features or change parameters in a digital fashion (such as a resistor using switches driven by digital output 315 to short out parts of it). As mentioned earlier, final test trimming in one embodiment may be used for trimming an over voltage threshold of the power supply controller, trimming an under voltage threshold of the power supply controller, trimming switching frequencies of the power supply controller, trimming a current limit of a power switch of the power supply controller, or the like.

In one embodiment, the schematic of FIG. 3 is substantially similar to the schematic of FIG. 1 with the exception of trim circuit 319 being illustrated. In one embodiment, trim circuit 319 can be included in the same power supply controller 101 as trim circuit 119. In such an embodiment, trim circuits 119 and 319 would be individually selected by different select lines (e.g. 137, 339) from decoder 125.

In one embodiment, trim circuit 319 includes a programmable circuit connection 303 coupled to the power supply terminal. In one embodiment, trim circuit 319 also includes a transistor 307 coupled between the power supply terminal a reference current source (not shown) through which a reference current $I_{REF}$ 317 flows. In one embodiment, the gate of transistor 307 is coupled to the drain of transistor 307. In one embodiment, a transistor 305 is coupled between programmable circuit connection 303 and digital output 315 of trim circuit 319. The gate of transistor 305 is coupled to the gate and drain of transistor 307. In one embodiment, a current source 313 is coupled between digital output 315 and ground. In one embodiment, current source 313 is a 1 microamp current source. Trim circuit 319 also includes a transistor 309 coupled between programmable circuit connection 303 and ground. In one embodiment, trim circuit 319 includes a current source 311 coupled between the gate of transistor 309 and ground. In one embodiment, current source 311 is a 1 microamp current source. In one embodiment, trim circuit 319 also includes a transistor 301 coupled between select line 339 and the gate of transistor 309. In one embodiment, the gate of transistor 301 is coupled to the drain of transistor 161 and the drain of transistor 155.

In one embodiment, if programmable circuit connection 303 is not programmed (i.e. not short circuited), then current source 313 pulls digital output 315 low. In one embodiment, if programmable circuit connection 303 is programmed (i.e. short circuited), then 10 microamps of current could flow through the current mirror formed with transistor 305, which would overpower the 1 microamp of current source 313, which would pull the digital output 315 signal high.

Similarly other programmable circuit connections that are desired to be programmed can be first selected by toggling counter 123 to the appropriate state and programming the programmable circuit connections as described above. In one embodiment, after all the required programmable circuit connections are programmed, the status of all programmable circuit connections can be confirmed or verified by toggling counter 123 to each state and increasing the power supply $V_{DD}$ voltage to 8V at each state while recording the $V_{DD}$ current (the supply current to power supply controller 101). For the states that point to the programmable circuit connections that are programmed, the $V_{DD}$ current is significantly higher than those states which point to the programmable circuit connections that were not programmed (about 50 mA in one embodiment).

Referring for example to trim circuit 119 of FIG. 1, the additional current is due to transistor 183 turning on. During the state in which select line 137 is active, if $V_{DD}$ is raised to for example 8V, the output of inverter 145 goes low, transistor 179 turns on, turning transistor 183 on. Since programmable circuit connection 181 was programmed, the drain of transistor 183 goes close to 8V and transistor 183 conducts as much current as its physical size allows. Had programmable circuit connection 181 not been programmed, the voltage at the drain of transistor 183 would be lower. The voltage drop across the zener junction and the respective resistive drop across the zener would limit the drain voltage of transistor 183 and the current would be much lower.

In another embodiment, programmable circuit connections that are programmed can be verified immediately after programming. In particular, the $V_{DD}$ supply current at 8V may be measured before programming the programmable circuit connection at 11.2V and then rechecked again at 8V to confirm that it is higher by the expected amount (e.g. 50 mA in one embodiment). If the programmable circuit connection was not programmed (e.g. no change in current) or not programmed properly (e.g. insufficient change in current) it can be reprogrammed. In one embodiment, this process can be repeated several times until a proper programming is achieved.

In one embodiment, after programming all of the desired programmable circuit connections, the final programmable circuit connection 149 of disable circuit 115 can be programmed to prevent any further accidental programming of the programmable circuit connections during normal operation of the power supply controller 101. Referring to the embodiment illustrated in FIG. 1, in order to program programmable circuit connection 115, the toggling of $V_{DD}$ between 6.4V and 4.3V should continue as shown on FIG. 2 until the S15 state and select line 141 is thereby activated by decoder 125. When programmable circuit connection 149 is programmed, the gate of transistor 155 is pulled high to $V_{DD}$ since programmable circuit connection 149 is short circuited. Since the gate of transistor 155 is high, transistor 155 turns off and transistor 161 turns on through inverter 159, pulling the gate of transistor 179 high, turning transistor 179 off permanently. Thus, any further trimming is not possible after programmable circuit connection 149 is programmed or short circuited.

Considering another power supply controller 101 where only programmable circuit connection 149 of disable circuit 115 is programmed, even if $V_{DD}$ is toggled again from the start in an attempt to program for example programmable circuit connection 181, select line 137 would go high, but since transistor 179 is permanently off, the gate of transistor 183 would never go high and transistor 183 would always stay off. Hence, transistor 183 can no longer program programmable circuit connection 181.

With regard to shutdown circuit 117, in one embodiment, over temperature threshold testing can be done at final test. As discussed, shutdown circuitry in one embodiment includes current source 169, current source 171, transistor 175 and resistor 177. In one embodiment, shutdown circuitry also includes adjustment circuitry including transistor 163, transistor 173, current source 167 and current source 165, which may be used for over-temperature threshold testing at final test.

In one embodiment, current source 169 generates a current $I_1$ proportional to the thermal voltage $V_T$. In one embodiment, the value of the voltage $I_1R$ across resistor 177 at room temperature is approximately 300 mV. With the $V_T$ variation (KT/q) across temperature, this voltage increases at a rate of 1 mV/° C. The $V_{BE}$ of the transistor 175 with collector current of $I_2$ from current source 171 is typically 650 mV at room temperature. It decreases at a rate of 2.2 mV/° C. In one embodiment, the current $I_2$ supplied by current source 171 is constant across temperature.

In one embodiment, during the final test, before programmable circuit connection 149 is programmed, the gate of transistor 173 is pulled low and transistor 173 is on. When counter 123 is toggled to the S15 state and select line 141 is activated, the gate of transistor 163 is high and, therefore, transistor 163 is off. The voltage across resistor 177 is then: $R \times (K_1I_1+I_1)$. This voltage across resistor 177 is designed to be lower than 650 mV at room temperature and is therefore not high enough to turn on transistor 175. Thus, over-temperature shutdown is not triggered and power switch 103 keeps on switching.

In one embodiment, when the S15 state is deselected and select signal 151 is deactivated, the gate of transistor 163 is low turning transistor 163 on. Thus, the voltage across resistor

177 increases to: $R\times(K_2I_1+K_1I_1+I_1)$. In one embodiment, this voltage across resistor 177 is now higher than turn on threshold voltage of transistor 175 at room temperature. As a result, transistor 175 turns on, pulling the collector of transistor 175 low and triggering an over-temperature shutdown. When the collector of transistor 175 goes low, the gate of the power switch 103 goes low through AND gate 107 and disables power switch 103 from switching.

In one embodiment, after programmable circuit connection 149 is programmed, the gate of transistor 173 is pulled high and transistor 173 permanently turns off, disconnecting the current sources 165 and 167 from resistor 177. Therefore, the over-temperature threshold of shutdown circuit 117 will no longer be adjusted and the over-temperature threshold will not be reached until the voltage across resistor 177, $I_1 \times R$, exceeds the $V_{BE}$ of transistor 175, which in one embodiment is approximately 135° C.

The governing equations of one embodiment of shutdown circuit 117 are listed below:

The thermal shutdown temperature of shutdown circuit 117 with $K_1$ approximately equal to 1.05 and $K_2$ approximately equal to 0.3 is:

$$[(650-I_1R)/(2.2+1)]+25° C.=134.4° C.;$$

the final testing low threshold is:

$$\{[650-(1+K_1+K_2)I_1R]/[2.2+(1+K_1+K_2)]\}+25° C.=12.9° C.;$$

the final testing high threshold is:

$$\{[650-(1+K_1)I_1R]/[2.2+(1+K_1)]\}+25° C.=33.2° C.;$$

the lowest threshold is:

$$[K_1I_1R/(2.2+1)]+25° C.=123.4° C.;$$

the highest threshold is:

$$[(K_1+K_2)I_1R/(2.2+1)]+25° C.=151.6° C.$$

In the foregoing detailed description, the method and apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method, comprising:
   selecting a trim circuit of an integrated circuit with a first external function terminal of the integrated circuit;
   applying a programming voltage to a second external terminal after selecting the trim circuit to program a first programmable circuit connection of the trim circuit, wherein the second external terminal is one of a supply terminal, a control terminal and a second function terminal of the integrated circuit;
   selecting a disable circuit of a power supply controller circuit; and
   applying the programming voltage to the second external terminal after selecting the disable circuit to program a second programmable circuit connection of the disable circuit, the disable circuit to disable the trim circuit of the integrated circuit from being further programmed.

2. The method of claim 1, wherein the integrated circuit is configured to operate with an operating voltage at the second external terminal and wherein the programming voltage is greater than the operating voltage.

3. The method of claim 2, wherein the operating voltage is a non-zero operating voltage.

4. The method claim 1, wherein the trim circuit is one of a plurality of trim circuits and wherein selecting the trim circuit of the integrated circuit with the first external function terminal of the integrated circuit comprises selecting one of the plurality of trim circuits with the first external function terminal.

5. The method of claim 1, wherein integrated circuit is a power supply controller.

* * * * *